(12) United States Patent
Daily

(10) Patent No.: US 12,400,632 B2
(45) Date of Patent: Aug. 26, 2025

(54) SYSTEM AND METHOD FOR POSTHUMOUS DYNAMIC SPEECH SYNTHESIS USING NEURAL NETWORKS AND DEEP LEARNING BY GENERATING PIXEL COORDINATES USING PORTABLE NETWORK GRAPHIC

(71) Applicant: Brock Daily, North Las Vegas, NV (US)

(72) Inventor: Brock Daily, North Las Vegas, NV (US)

(*) Notice: Subject to any disclaimer, the term of this patent is extended or adjusted under 35 U.S.C. 154(b) by 627 days.

(21) Appl. No.: 17/334,954

(22) Filed: May 31, 2021

(65) Prior Publication Data
US 2022/0383850 A1 Dec. 1, 2022

(51) Int. Cl.
*G10L 13/047* (2013.01)
*G06N 3/044* (2023.01)
(Continued)

(52) U.S. Cl.
CPC ............ *G10L 13/047* (2013.01); *G10L 13/08* (2013.01); *G10L 15/02* (2013.01); *G10L 15/063* (2013.01);
(Continued)

(58) Field of Classification Search
CPC .................................. G10L 13/08; G06N 3/044
See application file for complete search history.

(56) References Cited

U.S. PATENT DOCUMENTS 5,963,904 A * 10/1999 Lee ..................... G10L 15/04
704/E15.005
10,559,299 B1 * 2/2020 Arel ..................... G06N 7/01
(Continued)

FOREIGN PATENT DOCUMENTS

WO WO-2020002617 A1 * 1/2020 ............. G06F 16/51

OTHER PUBLICATIONS

Zachary J. Ruff; Damon B. Lesmeister; Cara L. Appel; Christopher M. Sullivan, Workflow and Convolutional Neural Network for Automated Identification of Animal Sounds, Jan. 28, 2021, Ecological Indicators vol. 124, https://www.sciencedirect.com/science/article/pii/S1470160X21000844 (Year: 2021).*

(Continued)

*Primary Examiner* — Farzad Kazeminezhad
(74) *Attorney, Agent, or Firm* — Steven Rinehart

(57) ABSTRACT

A system and method for posthumous dynamic speech synthesis digitally clones the original voice of a deceased user, which allows an operational user to remember the original user, post mortem. The system utilizes a neural network and deep learning to digitally duplicate the vocal frequency, personality, and characteristics of the original voice from the deceased user. This systematic approach to dynamic speech synthesis involves several stages of compression, coding, decoding, and training the speech patterns of original voice. The data processing of original voice includes audio sampling and a Lossy-Lossless method of dual compression. Additionally, the voice data is compressed to generate a Mel spectrogram. A voice codec converts the spectrogram into a PNG file, which is synthesized into the cloned voice. After the algorithmic operations, coding, and decoding of voice data, the subsequently generated cloned voice is implemented into a physical media outlet for consumption by the operational user.

4 Claims, 13 Drawing Sheets

(51) Int. Cl.
    *G10L 13/02*    (2013.01)
    *G10L 13/033*   (2013.01)
    *G10L 13/08*    (2013.01)
    *G10L 15/00*    (2013.01)
    *G10L 15/02*    (2006.01)
    *G10L 15/06*    (2013.01)

(52) U.S. Cl.
    CPC ........ *G06N 3/044* (2023.01); *G10L 2015/025* (2013.01)

(56) References Cited

U.S. PATENT DOCUMENTS

| | | | |
|---|---|---|---|
| 11,218,862 B1* | 1/2022 | Ma | H04M 3/5116 |
| 2010/0085363 A1* | 4/2010 | Smith | H04N 5/262 |
| | | | 345/473 |
| 2012/0278079 A1* | 11/2012 | Arrowood | G10L 15/02 |
| | | | 704/E15.005 |
| 2021/0217404 A1* | 7/2021 | Jia | G10L 13/033 |
| 2021/0350786 A1* | 11/2021 | Chen | G10L 15/063 |
| 2022/0068255 A1* | 3/2022 | Chen | G10L 15/063 |
| 2022/0122582 A1* | 4/2022 | Elias | G06N 3/044 |

OTHER PUBLICATIONS

Fuchs R; Maxwell O, The Effects of mp3 Compression on Acoustic Measurements of Fundamental Frequency and Pitch Range, 2016, InSpeech Prosody 2016 (vol. 2016, pp. 523-527), https://www.academia.edu/download/43717380/Fuchs_Maxwell16_effects_of_mp3_compression_on_f0_and_pitch_range.pdf (Year: 2016).*

* cited by examiner

FIG. 4

| b | d | f | g | h | dʒ | k |   |
|---|---|---|---|---|----|---|---|
| m | n | p | r | s | t | v | w |
| z | ʒ | tʃ | ʃ | θ | ð | ŋ | j |
| æ | eɪ | e | iː | ɪ | aɪ | ɒ | oʊ |
| ʊ | ʌ | uː | ɔɪ | aʊ | ə | eəʳ | ɑː |
| ɜːʳ | ɔː | ɪəʳ | ʊəʳ | - | - | - | - |

FIG. 5

| 1\|b | 00000001 | 12\|r | 00001100 | 23\|ŋ | 00010111 | 34\|ʌ | 00100010 |
|------|----------|-------|----------|--------|----------|--------|----------|
| 2\|d | 00000010 | 13\|s | 00001101 | 24\|j | 00011000 | 35\|uː | 00100011 |
| 3\|f | 00000011 | 14\|t | 00001110 | 25\|æ | 00011001 | 36\|ɔɪ | 00100100 |
| 4\|g | 00000100 | 15\|v | 00001111 | 26\|eɪ | 00011010 | 37\|aʊ | 00100101 |
| 5\|h | 00000101 | 16\|w | 00010000 | 27\|e | 00011011 | 38\|ə | 00100110 |
| 6\|dʒ | 00000110 | 17\|z | 00010001 | 28\|i | 00011100 | 39\|eəʳ | 00100111 |
| 7\|k | 00000111 | 18\|ʒ | 00010010 | 29\|ɪ | 00011101 | 40\|ɑː | 00101000 |
| 8\|l | 00001000 | 19\|tʃ | 00010011 | 30\|aɪ | 00011110 | 41\|ɜːʳ | 00101010 |
| 9\|m | 00001001 | 20\|ʃ | 00010100 | 31\|ɒ | 00011111 | 42\|ɔː | 00101010 |
| 10\|n | 00001010 | 21\|θ | 00010101 | 32\|oʊ | 00100000 | 43\|ɪəʳ | 00101011 |
| 11\|p | 00001011 | 22\|ð | 00010110 | 33\|ʊ | 00100001 | 44\|ʊəʳ | 00101100 |

9000

| x=1(1/16ms) y=(-1998Hz) a=179 | x=2(1/16ms) y=(-1998Hz) a=179 | x=3(1/16ms) y=(-1998Hz) a=150 |
|---|---|---|
| x=1(1/16ms) y=(-1999Hz) a=255 | x=2(1/16ms) y=(-1999Hz) a=219 | x=3(1/16ms) y=(-1999Hz) a=199 |
| x=1(1/16ms) y=(-2Hz) a=255 | x=2(1/16ms) y=(-2Hz) a=255 | x=3(1/16ms) y=(-2Hz) a=255 |

SYSTEM AND METHOD FOR POSTHUMOUS DYNAMIC SPEECH SYNTHESIS USING NEURAL NETWORKS AND DEEP LEARNING BY GENERATING PIXEL COORDINATES USING PORTABLE NETWORK GRAPHIC

FIELD OF THE INVENTION

This invention relates to a system and method for posthumous dynamic speech synthesis using neural networks and deep learning, and more particularly relates to a computer-implemented method of digitally cloning the voice of an original user through application of a neural network and deep learning, which enable duplications of the vocal frequency, personality, and characteristics of the original voice from the original user; and later implementing the cloned voice into at least one physical media outlet, such as an audio book or a stuffed toy, to enable an operational user to remember the original user, post mortem.

BACKGROUND

Description of the Related Art

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

In many instances, a person on the verge of dying desires to leave messages for those who survive them. This is commonly done through video messages that are viewable during a funeral service and at the reading of the individual's last will and testament. Currently, there are websites that provide services for leaving messages to a deceased's survivors.

Further, the prior art messaging services merely send messages at the time of the individual's death. However, some people may wish to leave messages that are delivered at particular milestones. For example, a parent may wish to leave messages for their children on their graduation day, or marriage. However, it is often the voice of the deceased individual that is most missed. The living relatives can relive nostalgic moments, merely by listening to the voice of the deceased loved one.

Generally, neural networks are a series of algorithms that mimic the operations of a human brain to recognize relationships between vast amounts of data, such as used in voice synthesis. Additionally, deep learning is an artificial intelligence (AI) function that mimics the workings of the human brain in processing data for use in detecting objects, recognizing speech, translating languages, and making decisions. Deep learning AI is able to learn without human supervision, drawing from data that is both unstructured and unlabeled.

It is also known that speech synthesis and image recognition often have the blanket term of 'Artificial Intelligence' placed upon them. Machine Learning is a form of AI that allows computers to run neural networks to predict outcomes in a way that mimics the human-brain. Neurons are the conduits for electrons inside of the human brain. Further, a perceptron is a node-structures that replicates this biological process. Each perceptron is fed an array of inputs at different weights. They correspond to different variables in the system's vocabulary. A methodology under the umbrella of neural networks is deep learning. This type of process allows node-structures to access countless, hidden perceptrons that can recalculate the weight of a given possibility using backpropagation.

Other proposals have involved voice synthesis systems. The problem with these gripping devices is that they do not utilize both neural network and deep learning to digitally duplicate the vocal frequency, personality, and characteristics of the original voice from the deceased user. Also, they do not employ data processing of original voice includes audio sampling and a Lossy-Lossless method of dual compression. Even though the above cited gripping voice synthesis systems meet some of the needs of the market, a computer-implemented method of digitally cloning the voice of an original user through application of a neural network and deep learning, which enable duplications of the vocal frequency, personality, and characteristics of the original voice from the original user; and later implementing the cloned voice into at least one physical media outlet, such as an audio book or a stuffed toy, to enable an operational user to remember the original user, post mortem, is still desired.

SUMMARY

From the foregoing discussion, it should be apparent that a need exists for a system and method for posthumous dynamic speech synthesis using neural networks and deep learning that provides a computer-implemented method of digitally cloning the original voice of a deceased user, which allows an operational user to remember the original user, post mortem. The method utilizes a neural network and deep learning to digitally duplicate the vocal frequency, personality, and characteristics of the original voice from the deceased user.

This systematic approach to dynamic speech synthesis involves several stages of compression, coding, decoding, and training the speech patterns of original voice. The data processing of original voice includes audio sampling and a Lossy-Lossless method of dual compression. Additionally, the voice data is compressed to generate a Mel spectrogram. A voice codec converts the spectrogram into a PNG file, which is synthesized into the cloned voice. After the algorithmic operations, coding, and decoding of voice data, the subsequently generated cloned voice is implemented into a physical media outlet for the operational user to remember the original user, post mortem.

Beneficially, such a system and method would produce a precise duplication of the vocal frequency, personality, and characteristics of the original voice from the original user through application of a neural network and a deep learning subsystem.

The method of operating such a system comprise an initial Step of recording a voice of an original user, whereby a voice data is generated. The recording may be performed on an audio recording device by the original user, who may be a presently deceased person or animal.

The method may further comprise a Step of compressing the voice data to form an audio file. Voice data compression process is known in the art may be used to compress the audio file into an MP3, or other suitable audio file format known in the art. cloud server will provide temporary storage for the MP3 files.

Another Step includes converting, through transcription, the voice data to text.

In some embodiments, a Step comprises matching, through phoneme identification, the text to a phoneme.

A Step comprises compressing, with a vocoder, the phoneme, whereby the compressed phoneme produces a spectrogram.

The method may further comprise a Step of converting the spectrogram into a Portable Network Graphic vector.

Another Step may comprise encoding, with the vocoder, the Portable Network Graphic vector to pixel coordinates, the pixel coordinates comprising time, frequency, and amplitude. The vocoder is operational with a neural network, which enhances the quality of the cloned voice.

Another Step includes decompressing, with the vocoder, the encoded pixel coordinates of the Portable Network Graphic vector to synthesize a cloned voice, the cloned voice being substantially a duplicate of the voice of the original user.

The method may further comprise a Step of constructing, with Bayesian inference, a neural network.

In some embodiments, a Step may include analyzing, with the neural network, a speech pattern in the cloned voice.

Another Step may comprise applying a backpropagation algorithm to recalculate the weight of at least one possibility of the cloned voice.

Another Step may comprise generating multiple phoneme clips of the cloned voice.

In some embodiments, a Step may include splicing the phoneme clips to produce phrases in the vocal frequency, personality, and characteristics of the cloned voice.

The method may further comprise a Step of storing the spliced phoneme clips on a user device or a physical media outlet for recreating the original voice of the original user. The user device can include a smart phone that is in connection with the training server, and the physical media outlet may include a stuffed toy having a speaker, transmitter, and receiver deployed inside the cavity of the toy.

A final Step includes streaming the phoneme clips of the cloned voice through the user device or the physical media outlet. In one exemplary use, the cloned voice of the original user transmits from a stuffed toy, or an audiobook.

In another aspect, the voice of the original user belongs a deceased human or animal.

In another aspect, the method further comprises a step of storing the voice data.

In another aspect, the step of compressing the voice data, further comprises compressing the voice data to a lossy MP3 audio file.

In another aspect, the Portable Network Graphic vector comprises a lossless gray scale Portable Network Graphic file.

In another aspect, the step of compressing, with a voice codec, the phoneme, further comprises running a primary lossy compression.

In another aspect, the step of compressing, with a voice codec, the phoneme, further comprises running a secondary lossless compression.

In another aspect, the method further comprises storing the phoneme clips and a tone variation of the cloned voice on a user device or a physical media outlet for recreating the original voice of the original user.

In another aspect, the spectrogram comprises a Mel Spectogram.

In another aspect, the method further comprises encoding, with the vocoder, the Portable Network Graphic vector to pixel coordinates, the pixel coordinates comprising time, frequency, and amplitude on a matrix grid.

In another aspect, the physical media outlet comprises an audio book or a stuffed toy.

Although the process-flow diagrams show a specific order of executing the process steps, the order of executing the steps may be changed relative to the order shown in certain embodiments. Also, two or more blocks shown in succession may be executed concurrently or with partial concurrence in some embodiments. Certain steps may also be omitted from the process-flow diagrams for the sake of brevity. In some embodiments, some or all the process steps shown in the process-flow diagrams can be combined into a single process.

In some embodiments, a system for posthumous dynamic speech synthesis using neural networks and deep learning serves to digitally clone the voice of an original user through application of a neural network and a deep learning subsystem that enable duplications of the vocal frequency, personality, and characteristics of the original voice from the original user. The system is provided with a plurality of modules configured to functionally execute the posthumous dynamic speech synthesis. These modules in the described embodiments include an audio device that is configured to record a voice of an original user, whereby a voice data is generated. The system may also utilize a compression device operable to compress the voice data to a lossy MP3 audio file.

In other embodiments, the system comprises a vocoder operable to convert, through transcription, the voice data to text; whereby a phoneme is matched with the text. The system may also include the vocoder compressing the phoneme, whereby the compressed phoneme produces a spectrogram. Further, the vocoder converting the spectrogram into a lossless grayscale Portable Network Graphic file having multiple pixel coordinates.

In other embodiments, the system enables the vocoder to encode the lossless grayscale Portable Network Graphic file to generate the pixel coordinates. Additionally, the vocoder decompresses the encoded pixel coordinates, whereby a cloned voice is synthesized, the cloned voice being substantially a duplicate of the voice of the original user.

In yet other embodiments, the system comprises Bayesian inference that is operable to construct a neural network. The neural network analyzes a speech pattern in the cloned voice. The system also includes a backpropagation algorithm. The backpropagation algorithm is applied to the speech pattern to recalculate the weight of at least one possibility of the cloned voice.

In yet other embodiments, the system comprises multiple phoneme clips that are generated from the cloned voice. The system also includes a splicer operable to splice the phoneme clips to produce phrases in the vocal frequency, personality, and characteristics of the cloned voice. The system also provides a training server operable to store the phoneme clips and a tone variation of the cloned voice. Finally, the system includes a user device that is configured to recreate the original voice of the original user, and play the cloned voice through a streaming signal.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 4 is a Table populated with a vocabulary database, in accordance with the present invention;

FIG. 5 is a Table populated with populated with a binary number and its equivalent, in accordance with the present invention;

Figure 1A:
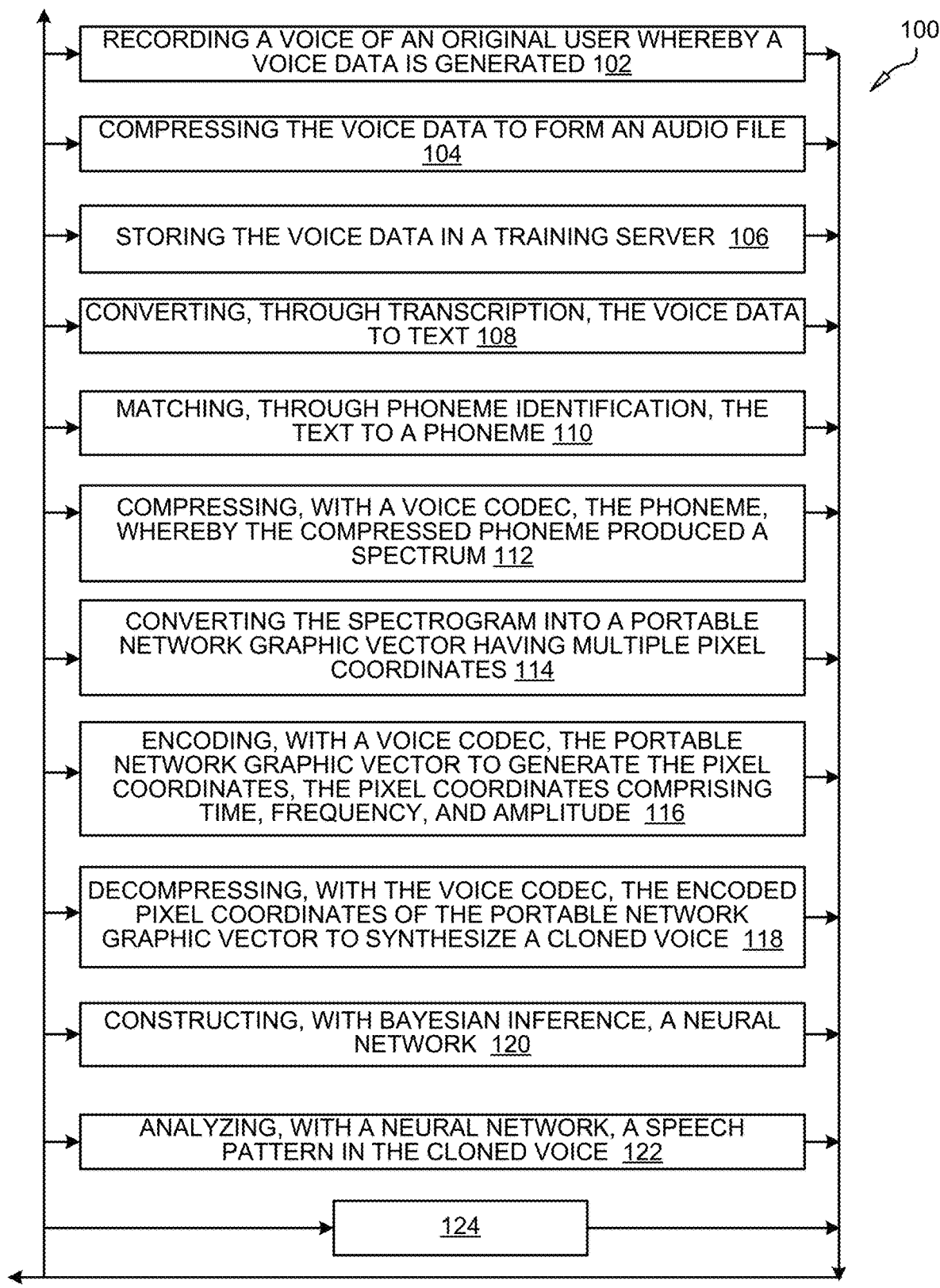
FIG. 1A is flow chart of an exemplary method for posthumous dynamic speech synthesis using neural networks and deep learning, in accordance with the present invention.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, the present invention is not limited to any particular tangible means of implementation.

All the features or embodiment components disclosed in this specification, including any accompanying abstract and drawings, unless expressly stated otherwise, may be replaced by alternative features or components serving the same, equivalent or similar purpose as known by those skilled in the art to achieve the same, equivalent, suitable, or similar results by such alternative feature(s) or component(s) providing a similar function by virtue of their having known suitable properties for the intended purpose. Thus, unless expressly stated otherwise, each feature disclosed is one example only of a generic series of equivalent, or suitable, or similar features known or knowable to those skilled in the art without requiring undue experimentation.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

DETAILED DESCRIPTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 1B:
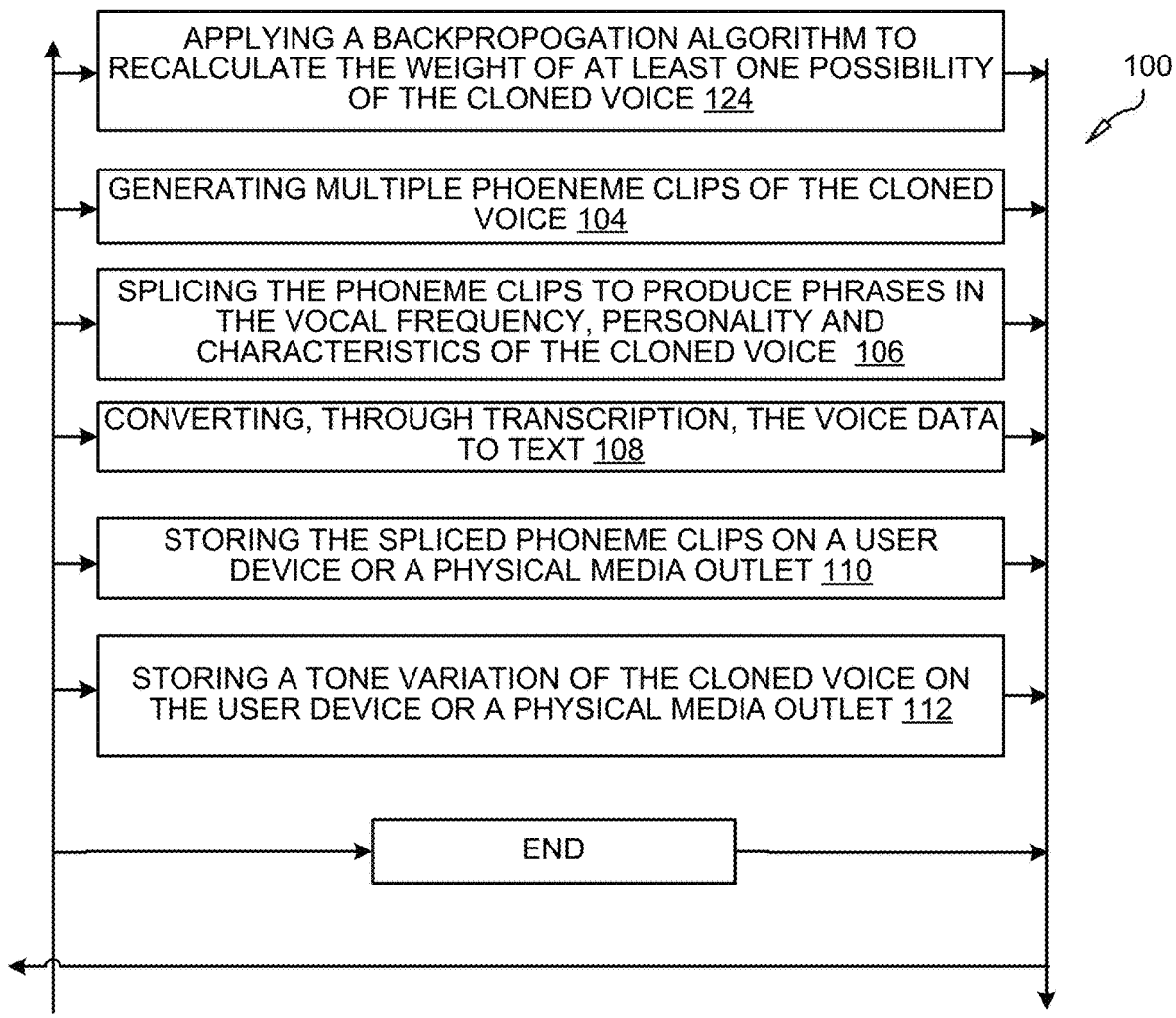
FIG. 1B is a flow chart of an exemplary method for posthumous dynamic speech synthesis using neural networks and deep learning, in accordance with the present invention.

FIGS. 1A-1B depict a flowchart of an exemplary method 100 for posthumous dynamic speech synthesis using neural networks and deep learning. The method 100 is a computer-implemented process of digitally cloning the voice of an original user 202, who may be a presently deceased human or animal. The method 100 utilizes a unique and novel application of a neural network, and a deep learning subsystem that duplicates the vocal frequency, personality, and characteristics of the original voice from the original user 202. The method 100 provides a systematic approach to dynamic speech synthesis involves several stages of compression, coding, decoding, and training the speech patterns of original voice. The data processing of original voice includes audio sampling and a Lossy-Lossless method 100 of dual compression. Additionally, the voice data is compressed to generate a Mel spectrogram. A voice codec converts the spectrogram into a PNG file, which is synthesized into the cloned voice. After the algorithmic operations, coding, and decoding of voice data, the subsequently generated cloned voice is implemented into a physical media outlet for the operational user to remember the original user 202, post mortem.

In some embodiments, the method 100 includes an initial Step 102 of recording a voice of an original user 202, whereby a voice data is generated. The recording may be performed on an audio recording device by the original user 202. The original user 202 may include, without limitation, a deceased human or animal that recorded sounds, phrases, phonemes, and utterances before dying, so as to relay messages or simply to keep the original voice 206 in memory by loved ones.

Figure 2:
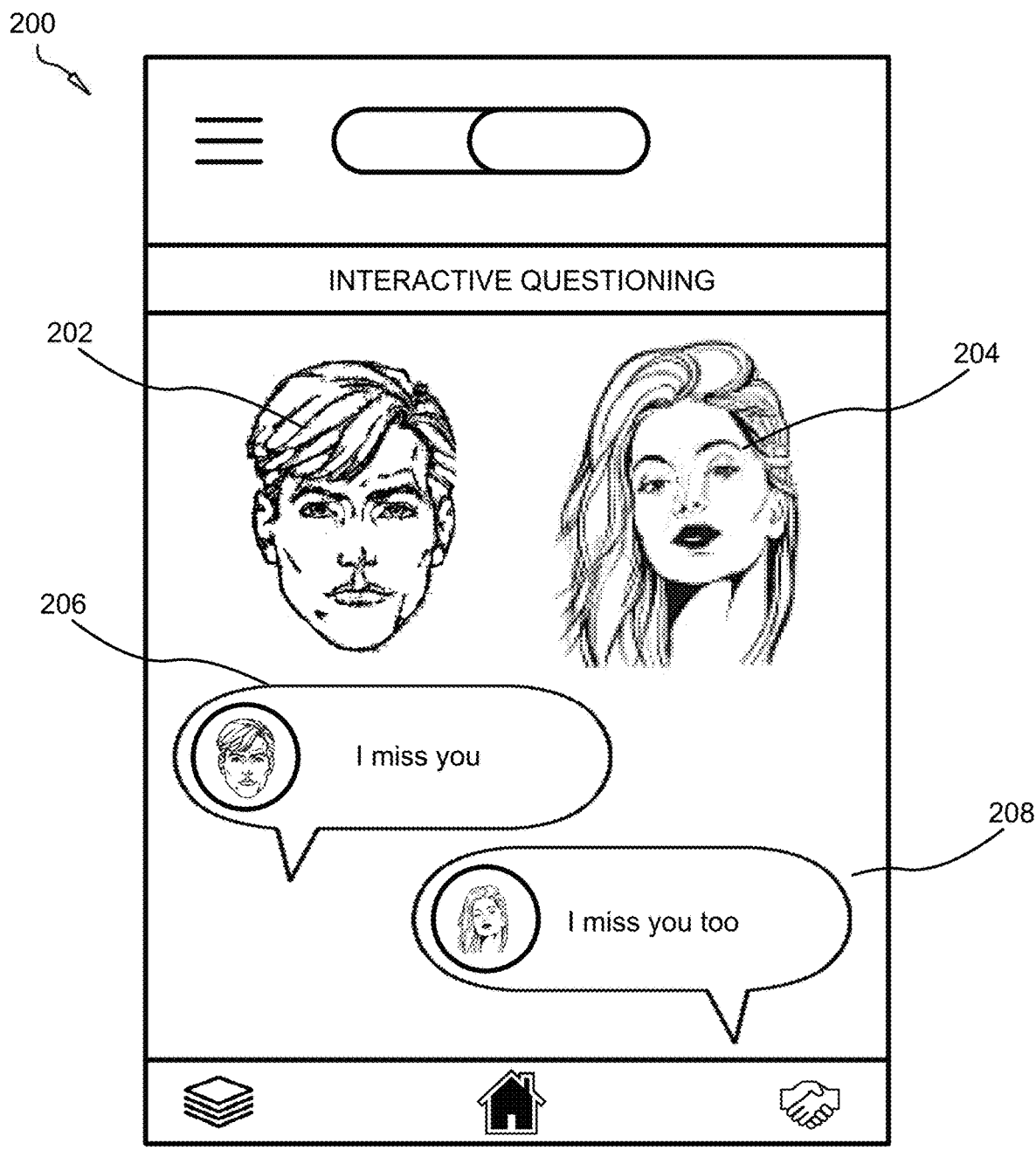
FIG. 2 is a top view of an exemplary audio recording device, showing the original deceased user communicating with a cloned voice to the operational user, in accordance with the present invention.
Figure 3:
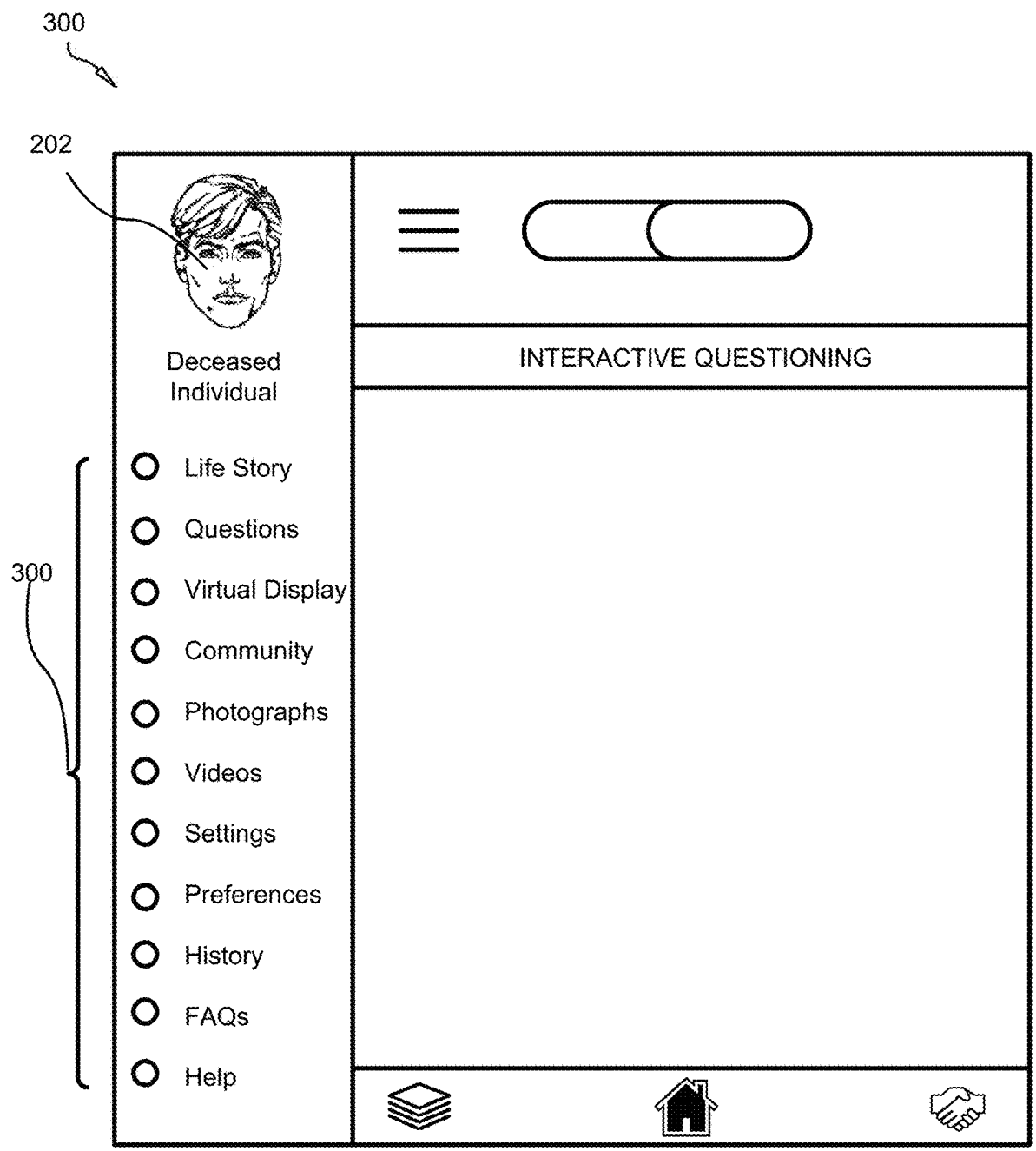
FIG. 3 is the audio recording device, showing the original deceased user communicating from one of many topic themes to the operational user, in accordance with the present invention.

FIGS. 2-3 reference an audio recording device 200, 300 such as a smart phone, that is used by original user 202 to record words, phrases, sounds, and other utterances. The voice 206 of the original user 202 can be recorded so that operational users 204 can listen to a cloned version of the voice 206, and thereby remember the original user, post mortem. Additionally, an operational user, such as a loved one of a deceased original user 202 may also respond 208 to the original user 202, before the original user 202 dies, for example during a two-way conversation. In another possible embodiment of recording the original voice 206, an audio recording device 200 is shown in FIG. 3. Here, the original user 202 records the voice 206 on the device 200, with the message being a themed topic 300. The topic 300 can later be played back in its original voice, or synthesized to achieve the cloned voice, by the operational user 204. Exemplary themes that can be recorded may include, without limitation, life story, questions, community, and videos. Additional parameters on the audio recording device 200 may include, FAQ's, help, and setting preferences.

It is known in the art that when the original user 202 speaks into the microphone of an audio device, air molecules are displaced by oscillating vocal chords in the larynx. Particles are pushed against one another to transfer waveforms across a given environment. A thermodynamic process called the 'adiabatic process' allows the sound to travel through space, only transferring energy as "work" or macroscopic forces on the environment's surroundings. An observational location in the audio device's microphone samples the repetition (Hertz/Hz) of such waveforms as they push air molecules against a diaphragm that sends analog inputs to a digital system using electromagnets (A/D Converter). The analog signal creates two different inputs (1, 0) that the audio device can interpret. Each signal is stored digitally as bits. In one possible embodiment. 16 bits of information to produce a single sample.

It is significant to note that the subsequently produced cloning voice only requires a sample rate of 16 kHz or 16,000 repetitions/samples every second. The basic sample rate for professional vocals is 16-24 bit, 44.1 kHz. However, it is known in the art that most audio devices in the current market have recording hardware capable of 44,100 samples with 16 bits of data (705,600 bits/second) to 48,000 samples with 24 bits (1,152,000 bits/second).

Thus, when the original user 202 speaks in a regular tone and style, the frequency-range is approximately 2 kHz. This detail enables safe removal of bits from irrelevant frequency ranges. It is also known in the art that psychoacoustics state that minimal reductions in "perceived" audio quality occur when frequency ranges outside of human-hearing are removed. Ultrasounds (frequencies above 20 kHz) and infrasound (frequencies below 20 Hz) are unintelligible to most people. These details provide a range of valuable data, allowing the method 100 to prioritize bits from relevant ranges and reduce unnecessary data to provide a smaller file size.

The method 100 may further comprise a Step 104 of compressing the voice data to form an audio file. Voice data compression process is known in the art may be used to compress the audio file into an MP3, or other suitable audio file format known in the art. cloud server will provide temporary storage for the MP3 files. In one non-limiting embodiment, the voice data is compressed to a lossy MP3 audio file.

In one embodiment, the audio device has recording software that creates an MP3 file with a frequency range of 4 kHz at a sample rate of 16 kHz. After this initial compression, the subsequently generated phonemes, discussed below, have between 800 and 8000 samples per-phoneme over the course of approximately 50-500 milliseconds. This large variance is because vowels and consonants have different time outputs. The results are prepared for another compression/conversion that converts the audio signals into PNG vectors, also discussed below. In this manner, when recording sample rates of the original user 202 are below 10 kHz/phoneme, they can easily be encoded to represent pixel coordinates in association with time, frequency, and amplitude (X, Y, Z) 802*a-c* referenced on a matrix grid 802 (See FIG. 8).

In other embodiments of the method 100, an additional Step 106 of storing the voice data in a training server occurs. The storage may be on a Cloud, or a training server. Thus, when the original user 202 initiates the 'Stop' function while recording, the audio file automatically uploads to a cloud server from the audio device. A database receives the file as a folder input from the registered user. The folder name or 'code name' is a unique password/username hybrid that identifies that particular user and who the recipients are. An encryption technique is used to protect user information (several encryption techniques satisfy the requirements). The cloud server provides temporary storage for the MP3 files.

In one possible embodiment, a parameter function provides two paths for the file once it's been uploaded. In a first path of activation, the MP3 files are copied and immediately transferred to the training servers to 'clone' the original user's voice 206. This path is for users who wish to access their clone instead of storing their voice 206 for an activation/cloning later on. A prefixed transcription will be run, allowing synthesis to begin.

In a second path of LAN Storage, every 24 hours, the cloud server is wiped. The data is downloaded onto an external hard drive, which is physically removed and transferred to a LAN (Local Area Network) where each 'code name' is encrypted and stored as copies in two external drives as well as the network itself. The two backup drives are disconnected and securely housed between file updates. Thus, when the operational user, or original user 202 wants to activate their clone, they simply login to the platform and request the 'codename'. This phrase is only shared with the original user 202 and trusted recipients—once activated, the file is uploaded back to the cloud server with an activation tag.

Another Step 108 includes converting, through transcription, the voice data to text. In one possible embodiment, automated Speech-to-Text (STT) converts audio inputs to text outputs without guidance. These systems often use pre-trained techniques to guess, with extremely high accuracy, the intended words of the speaker. The 16 bit-16 kHz recordings are pre-transcribed, bypassing the need for dynamic listening during transcription for voice-clones. The method 100 has a vocabulary that is synchronized with a copyrighted script.

The voice codec and transcription device only require an 8-16 kHz sample rate. The analog inputs are technically infinite, so only a portion can be sampled digitally. Instead of capturing unneeded information, any frequency data above 2 kHz or below 50 Hz is removed, as the human speaking voice falls in this range. As far as bits and storage sizes go:

Thus, by reducing the sample rate to 16 kHz, the system reduces the incoming data by 63.7188% (705,600 b-256,000 b) before the actual MP3 compression begins.

It is also significant to note that the industry standard raw input: (10.58 MB/Minute|11411.2 kbps). Also, in the industry, 44.1 kHz recording with 16 bits of data=705,600 bits/second*2 Channels=1,411,200 kbps of analog data being received.

However, the present method 100 utilizes more efficient inputs, having a raw input of (3.84 MB/Minute|512 kbps). Also, 16 kHz recording with 16 bits of data=(256,000 bits/second)*2 Channels=512 kbps or 3.84 MB/Minute of digital data being recorded. The MP3 lossy compression of A|D input: (1.92 MB/Minute|256 kbps). And 16 kHz recording with 16 bits of data=256,000 bits/second=1.92 MB/Minute of digital data being recorded.

In some embodiments, a Step 110 comprises matching, through phoneme identification, the text to a phoneme. The script contains particular words in different, unorthodox patterns. This method 100 supplies multiple variations of every (English) phoneme in a short, condensed reading—removing the need for longer recordings. The English language has 44 phonemes or sounds that are made during linguistic communication. There are 24 consonants and 20 vowels; each is unique and is classified by an IPA (International Phonetic Alphabet) character. Below are examples of what will be read by the user during the cloning process. It is also significant to note that the International Phonetic Alphabet (IPA) is utilized. The IPA is a collaborative approach to cataloging phonemes in a universal alphabet for every language to understand. All 120 phonemes are included in the IPA, allowing the clone herein described to speak in any current language wherein the phoneme data is supplied using an added script.

As FIG. 4 references, the English language can be manifested from a specific particular list of sounds, shown in Table 400. Table 400 is populated with multiple terms 402*a*, 402*n*. Each vocabulary term 402*a*, 402*n* is storable in the database, and synchronized with each voice recording. Through use of such a comprehensive vocabulary list, every recorded word is tactically placed to clip and sort phonemes according to their graphemes (textual layout of phoneme) on the final cloned voice script. Furthermore, an algorithm clips the recording by searching for "dips" on the waveform. When the user waits 500 milliseconds (for example) between nominal inputs—the system is instructed to analyze the previous frequency pattern and categorize it as a particular word depending on the clip's position in the script. This methodology bypasses dynamic transcription.

It is known in the art that phonemes are ways of representing multiple letters (graphemes) through a unique sound, this means that the International Phonetic Alphabet is more efficient at transferring text in relation to binary. The word "approach" has 64 bits of data (8 bits/byte|1 byte/character). The IPA spelling would be "(ə)-(p)-(r)-(oʊ)-(tʃ)". The characters are encoded to reflect the chart below, reducing the data transfer from 64 bits to 40 bits. On average, the IPA requires less data to capture entire words, sentences, and dialogue in general. Instead of using normal character values in binary, the IPA is synchronized with decimals (1-44) in 8-bit formatting.

The method 100 can also incorporate HEX conversions or algorithms that save space by compressing this chart with pre-existing compression methods. As a base level to understand this process, Table 500 is populated with binary numbers 502*a* and their equivalent 502*n*. (FIG. 5). In one exemplary use of Table 5, a decoder receives the binary equivalent of (32|00100000), the method 100 references a custom vocabulary, and sends an output for (oʊ) to whatever function is being prepared. An algorithm matches inputs with predetermined outputs—expanding back to normal bit size, with help from parameters of the phoneme.

A Step 112 comprises compressing, with a voice codec, the phoneme, whereby the compressed phoneme produces a spectrogram. In one non-limiting embodiment, the spectrogram comprises a Mel Spectrogram.

Figure 6:
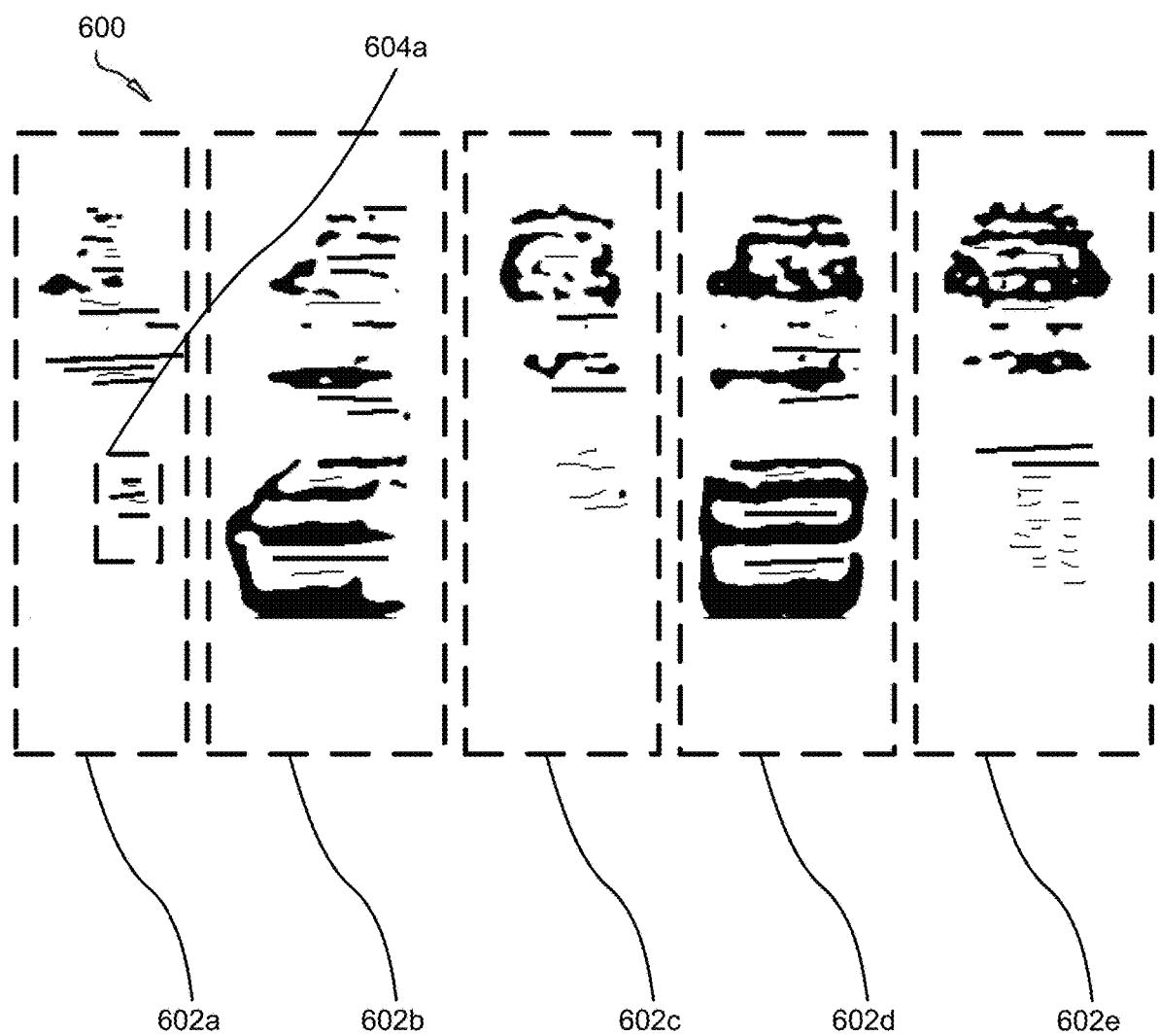
FIG. 6 is an exemplary Mel Spectrogram, showing a graphical depiction of the voice of the original user, in accordance with the present invention.

FIG. 6 references an exemplary Mel Spectrogram, showing a graphical depiction of the voice 206 of the original user 202, counting to five. The lower frequencies of the numbers can be seen perfectly, the nasally 'n' at the end of "one" is located at the lower-left. The X, Y, and Z coordinates can be visualized as a 3-D vector.

In some embodiments, the Step 112 of compressing the phoneme, has an additional limitation of running a primary lossy compression. In other embodiments, the Step 112 of compressing the phoneme, further comprises running a secondary lossless compression. It is known that Lossless files are industry standard for proper recording and audio editing. However, the method 100 utilizes audio that represents the frequencies found in the human voice. A loophole provides clearance to utilize Lossy-Lossless methods to run a primary Lossy compression, followed by a secondary Lossless compression into a PNG file. In one embodiment, an MP3 activation (lossy) requires that, after being activated, the user's compressed file is transcribed and clipped according to phoneme. In another embodiment, MP3 encoding prep (lossless) includes audio files of certain phonemes are cataloged by converting MP3 data into a lossless Portable Network Graphic (PNG).

Independent of the developer's method of compression, each character is ultimately matched with a vocoder sample for that particular phoneme. The file size depends on the phoneme's length in time (pixel width), with set parameters for the frequency range of the recording (pixel height). Thus, the voice codec requires at least three inputs to replicate the human voice accurately: frequency, time, and amplitude of each voice sample. In one possible embodiment, a Mel spectrogram helps visualize the waveform in a three-dimensional format. The (X) axis is the samples/time, the (Y) axis is the frequency level at that point in time, and (Z) is the amplitude from 0-1 for the sample's intensity.

Figure 7:
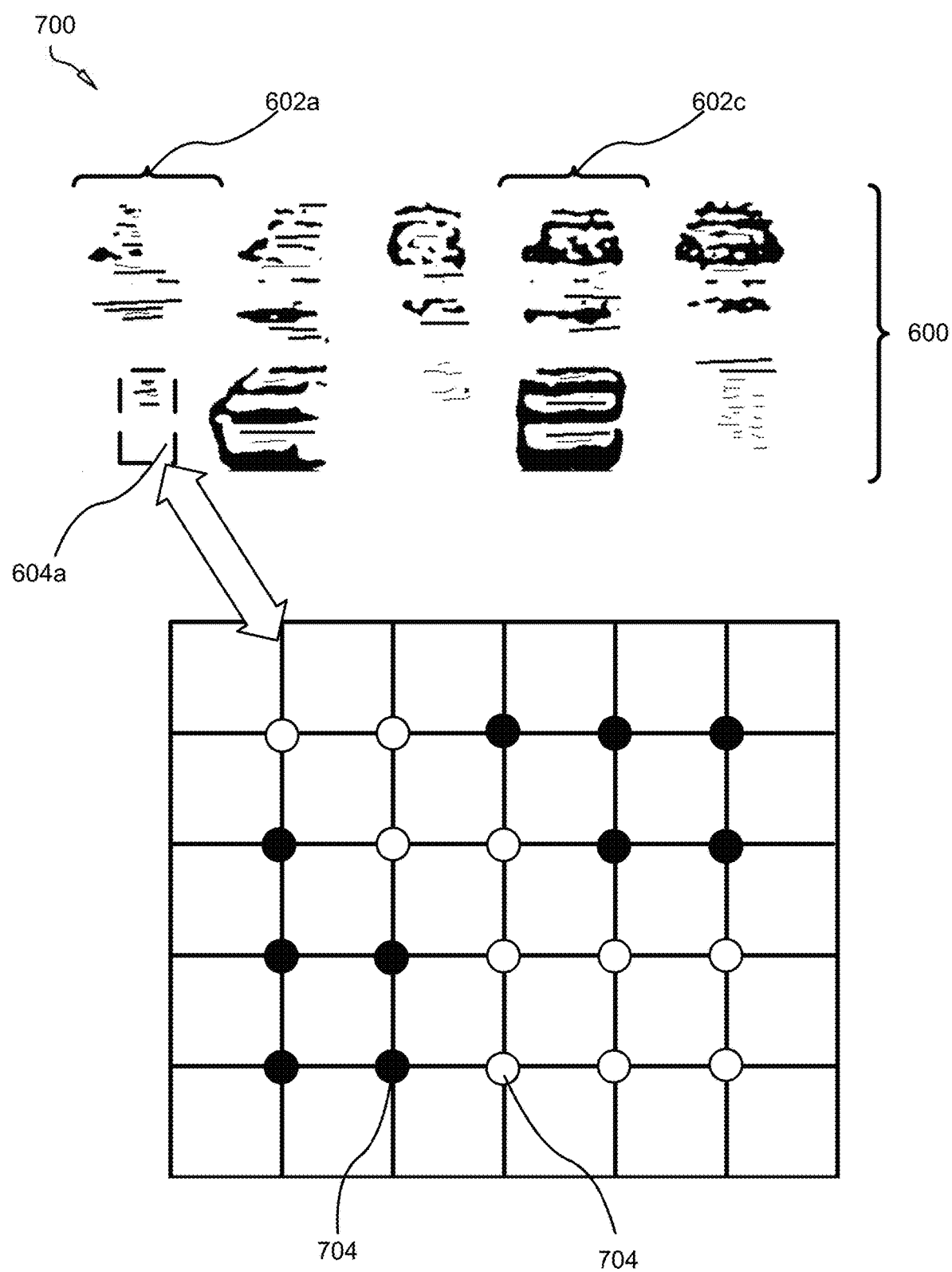
FIG. 7 is a diagram, showing a spectrogram converted to a PNG vector, in accordance with the present invention.

An additional Step 114 comprises, converting the spectrogram 600 into a Portable Network Graphic vector 700. At least a portion of the spectrogram 600 is converted, such that the PNG vector 700 is generated therefrom. In some embodiments, the PNG vector 700 is defined by multiple pixels. The pixels have multiple coordinates 800a, 800b, 800c. Each pixel represents a data point. As illustrated in FIG. 7, data point 702 reads 12 Hz at 2/44.1 MS with an amplitude of 100%, with a color RGB=0,0,0. And data point 704 reads 0% amplitude for this frequency. In one non-limiting embodiment, each data point references a pixel coordinates 800a-c for frequency, time, and amplitude.

An exemplary set of pixel coordinates 800a-c is as follows: [P=Pixel, PA=Pixel Area, T=Phoneme Length in Milliseconds, R=Sample Rate Per Second, A=Amplitude Weight from 0-1, Metadata=Header information and image details]. PNG File Size (bits)=[(PA*16)+Metadata]−Redundancies. The final, compressed PNG enables shortcuts for redundancies in the pixel layout. For example, 150 consecutive pixels with no data are displayed as 255.

The method 100 converts the spectrogram 600 into an encoded, grayscale PNG vector. The metadata at the beginning of the binary chain includes sizing data, which is calculated with the following formulas:

PNG Area (PA)=PNG Width*4000. The frequency range is 4 kHz which converts to 4000 (P). When multiplied by the (P) Width, the (PA) can be calculated.

PNG Width (P)=T*(R/1000)=T*(16,000/1,000)=T*16. If the character takes 95 ms to pronounce at 16 samples/ms, then 'æ' would have a width of 1520 pixels when converted to PNG.

PNG Grayscale (A)=255−(A*200).

Each pixel receives a color input from 0-255. The image recognition and codec utilize the color value to read the amplitude weight. The weight is multiplied by 200 and subtracted from a starting point of 255 (white). As the number decreases, the pixel darkens. And consequently, 255 is 0% and 55 is 100% intensity.

Furthermore, when the original recording sample rates from the original user 202 are below 10 kHz/phoneme, they can easily be encoded to represent pixel coordinates in association with time, frequency, and amplitude (X, Y, Z) on a matrix grid.

Another Step 116 includes encoding, with the voice codec, the Portable Network Graphic vector to generate the pixel coordinates 800a-c. The voice codec is operational with a neural network, which enhances the quality of the cloned voice. In one possible embodiment, a dual-compression methodology is used to save storage and retain sound quality when preparing the data for neural networks.

Figure 8:
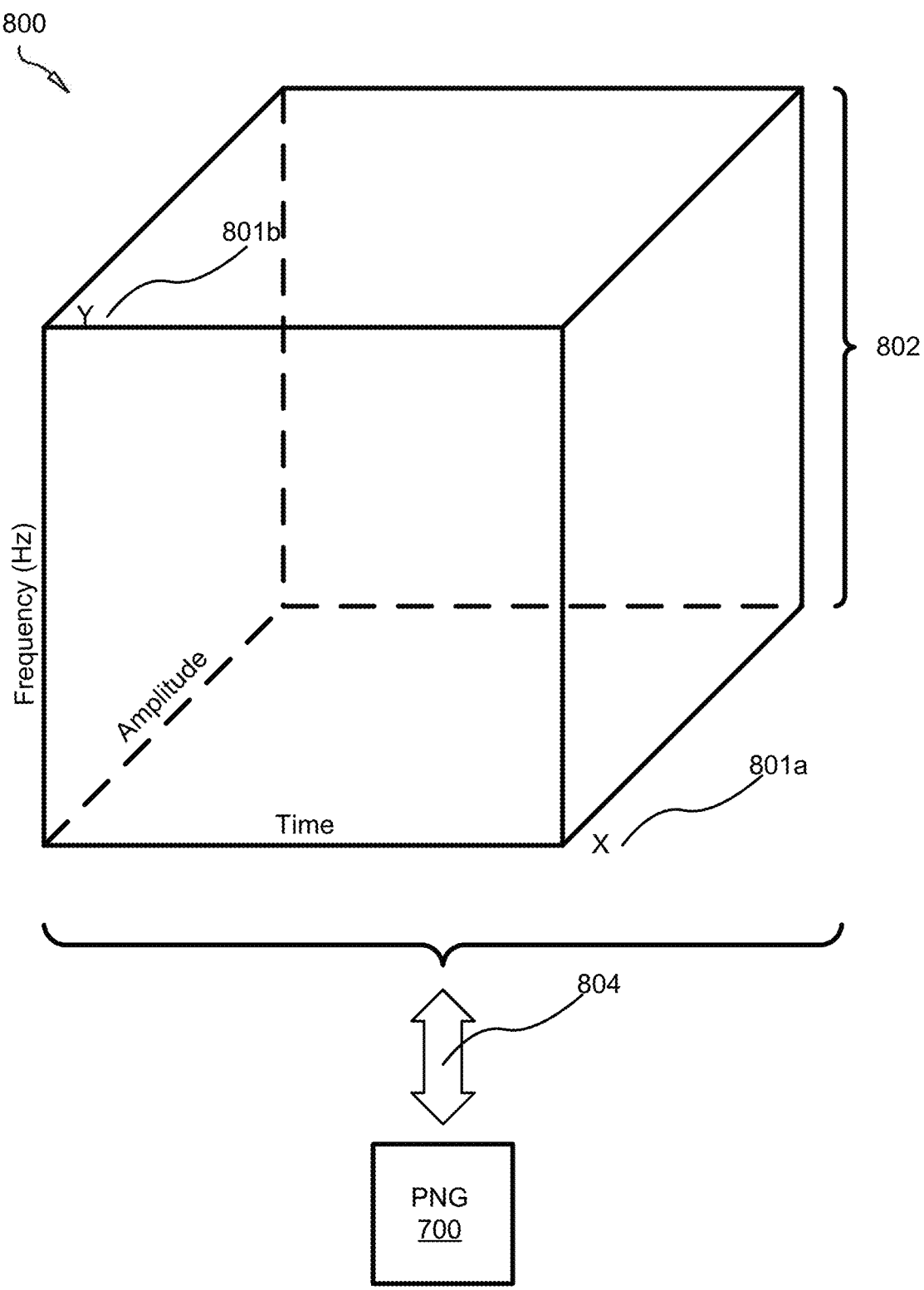
FIG. 8 is a diagram showing the pixel coordinates for the PNG vector, in accordance with the present invention.

As FIG. 7 illustrates,

As FIG. 8 illustrates, the pixel coordinates 800a-c include: time 800a, frequency 800b, and amplitude 800c. In one non-limiting embodiment, the Portable Network Graphic vector 700 comprises a lossless grayscale Portable Network Graphic file. The pre-compressed Lossy MP3 files are converted to Lossless, Grayscale PNGs to train with image recognition systems. The results are run through a vocoder after being decoded from the PNG file to produce the synthetic frequencies of the clone.

Another Step 118 includes decompressing, with the voice codec, the encoded pixel coordinates of the Portable Network Graphic vector to synthesize a cloned voice. The cloned voice is substantially a duplicate of the voice of the original user 202; especially after being synthesized by the neural network and the deep learning subsystem. The voice codec can use a decoder to synthesize the voice of the original user 202. The encoded files are stored as lossless PNG files for training on neural networks. Each pixel holds data from different samples.

Figure 9:
FIG. 9 is a Table referencing an exemplary 9×9 pixel formation from a PNG vector of a spectrogram, in accordance with the present invention.

Table 900 references an exemplary 9×9 pixel formation from a PNG vector of a spectrogram (FIG. 9). In this formation, (X=Time in Samples), (Y=Frequency in Hertz), and (A=Amplitude in Grayscale Ratio). Thus, each phoneme has a different visual representation. Looking back at FIG. 6, the spectrogram 600 represents an original user 202 saying the 'sss' and 'zzz' sounds repeatedly. The lower frequencies in the 'zzz' sound can be recognized with image recognition. By compressing audio into images, the ability to sort, transcribe, and synthesize voices becomes possible on weaker systems. Mobile devices can retain vocoder samples to reference inputs from whatever task is being run on the application's servers, or potentially train them locally.

In some embodiments, the method 100 may further comprise a Step 120 of constructing, with Bayesian inference, a neural network. The method 100 uses Bayesian Inference to construct accurate neural networks that model given data. Machine Learning methods that use Deep Learning can backpropagate with Bayesian Inference to produce results with higher accuracies by comparing newly-weighted results with previous calculations in the hidden layers.

Those skilled in the art will recognize that speech synthesis and image recognition are referred to as artificial intelligence (AI). Machine Learning is a form of AI that allows computers to run neural networks to predict outcomes in a way that mimics the human-brain. It is also recognized that neurons are the conduits for electrons inside of our brains. It is also recognized that a perceptron is a node-structure that replicates this biological process. Each perceptron is fed an array of inputs at different weights, corresponding to different variables in the system's vocabulary.

In some embodiments, a Step 122 may include analyzing, with the neural network, a speech pattern in the cloned voice. Once the MP3 files are converted to lossless images, a neural network analyzes the speech patterns associated with known and unknown variables represented by the given data. This process starts with breaking down the image from a 'god-view' perspective, separating pixels into 8×8 frames. This would reduce the area of a 3000 p×4000 p image from 12 +e 6 pixels to 187,500 inputs to analyze. This is a 98.4375% reduction in variable inputs/beginning layer of the network.

Those skilled in the art will also recognize that neural networks are layered structures with multiple perceptron nodes. There are multiple types of these structures such as Convolutional Neural Networks (CNN) and Recurrent Neural Networks (RNN). Every type has an input layer and an output layer. This only produces minimal results for basic processes, in order to train data against an algorithm to synthesize the human voice. The neural networks need multiple hidden layers to increase the system's accuracy.

Transcription models can view live spectrogram generations and decipher the phoneme/word based upon prior data using these methods. The PNG vector containing sample data is read by the training system at the 8×8 reduction to calculate probabilities of a certain phonemes. For example, one node may check for high concentrations of darker pixels in the lower frequencies, changing the weighted probability of certain phonetic outcomes.

The vocoder is operational with the neural network, which enhances the quality of the cloned voice. Perception and psychoacoustics come back into the mix. For example, a genuine voice has slight details that change the frequency, duration, and tonality of these phonemes. A set of parameters choreograph the block-chain creation of phonemes. Thus, when the vocoder articulates, "I hate you!", the original user 202 may have had the intent of actual hate or humorous play to be outputted. The neural network runs the request against prior knowledge and new variables the current perceptron branch is calculating. If the tonality of the prior request was playful, a softer frequency will be applied to the phonemes in the vocoder. Otherwise, the system will output audio in an 'angry' tone.

Another Step 124 may comprise applying a backpropagation algorithm to recalculate the weight of at least one possibility of the cloned voice. In the Bayesian inference a hidden node with a particular set of parameters deduces the weight/accuracy of an output's possibility and references the hidden layer behind it. This backpropagates to 'double-check' the analytical results of the previous perceptron-branch against a new possibility.

It is known in the art that Bayes Theorem is a mathematical formula used to predict the possibility of an occurrence (A), given the knowledge of another variable having already occurred (B). In short, the probability of (A) (given B), equals the result of (B) (given A) multiplied by the probability of (A), then divided over the probability of (B).

$$P(A|B)=P(B|A) \times P(A)/P(B)$$

This applies to neural networks used in speech synthesis, from transcription to the vocoder generation. Every perceptron can initiate this formula for a particular set of parameters. For example: What's the probability of the recorded phoneme (A) being the IPA character (eə$^r$), given that sample length (B) is 200 ms?

The answer is the equivalent of: The probability of (B) lasting a minimum of 3200 samples/200 ms given (A) is the IPA character (eə$^r$), multiplied by the probability of the phoneme being (A) [an untrained model would start at ¼₄ and update this probability based on the training sessions], then divided over the probability of (B)'s sample length in relation to each phoneme.

When used for probability distributions, Bayes Theorem morphs into Bayesian Inference. The set parameters of (A) are now described as Theta (Θ) which represents the mean (μ) and standard deviation (σ) of those parameters. (B) is written as data to represent the integers or numbers being represented.

$$P(\Theta|\text{Data})=P(\text{Data}|\Theta) \times P(\Theta)/P(\text{Data})$$

The method 100 uses Bayesian Inference to construct accurate neural networks that model given data. Machine Learning methods that use Deep Learning can backpropagate with Bayesian Inference to produce results with higher accuracies by comparing newly-weighted results with previous calculations in the hidden layers. Neural networks use this to compare layer outputs with each other as they are backpropagated during the next layer's process.

An exemplary transcription system may follow the following process: A recording of the word "Synthesis" has 44 phonetic results the network is searching for. Each phoneme can be referenced in order as 1,2, 3, etc. for the system. As the Deep Learning system clips the audio using AI, the layers weigh probabilities of each phoneme as the frequency samples are read. Parameters during backpropagation show that when the probability of a sample being phoneme (2) is 65%, it will reference the previous layer with different parameters, revealing a final weight of 30% and matching with phoneme (3) for 95%.

In some embodiments, a Step 126 may comprise generating multiple phoneme clips of the cloned voice. The phoneme may include a unit of sound that distinguishes one word from another in a particular language. Another Step 128 comprises splicing the phoneme clips to produce phrases in the vocal frequency, personality, and characteristics of the cloned voice. The audio output is a splicing of these phoneme clips, merged together to form words and sentences. Text-to-Speech interfaces transfer requests to the local system (user device) to process. Dynamic feedback with transcription and speech synthesis requires large amounts of bandwidth. The codec system established in Phase 3 will return, allowing the training system to send a couple of bits instead of audio files with bit rates of 320,000 bits per second.

There are two functions of the method 100 in regards to the processes of generation of the cloned voice. The first embodiment is a Text-to-Speech (TTS) process, which enables insertion of strings of information, without the assistance of an automated transcriber. The TTS process for word construction stays the same, using neural networks to accurately piece together and accurately depict the phrasing.

In the TTS process, the following steps may be utilized:
The user types a request into the application;
The string of bits is encoded to IPA alphabet codec;
Encoded phonemes are uploaded to the training/response system;
The tonality variations are implemented based upon sentence structure;
Words are constructed and intervals established between words and commas;
Training/response system encodes correct phoneme/sample/frequency structure;

Vocoder decodes system relay, converts data into MP3 file with vocoder samples; and Device speakers send audio output to the user.

In a second embodiment, a Speech-to-Text (STT) process is part of the dynamic feedback loop. The SST process allows the user to speak back and forth with the invention, establishing basic dialogue between the user and device. When performing dynamic feedback, the transcription system will analyze spectrogram/PNG inputs of the voice and automatically convert them using methods in this document.

This may include the following steps:

The user speaks into the microphone of application's device;

Raw audio is transcribed into text/string;

The string of bits is encoded to IPA alphabet codec;

Encoded phonemes are uploaded to the training/response system;

The tonality variations are implemented based upon sentence structure;

Words are constructed and intervals established between words and commas.

Results are relayed after encoding;

Training/response system encodes correct phoneme/sample/frequency structure;

Vocoder decodes system relay, converts data into MP3 file with vocoder samples;

Device speakers send audio output to user; and

User contemplates response—returning to the first step.

In some embodiments, the method 100 may further comprise a Step 130 of storing the spliced phoneme clips on a user device or a physical media outlet. The user device or the physical media outlet stores the synthesized vocoder samples of every phoneme, including tone variations.

Figure 10:
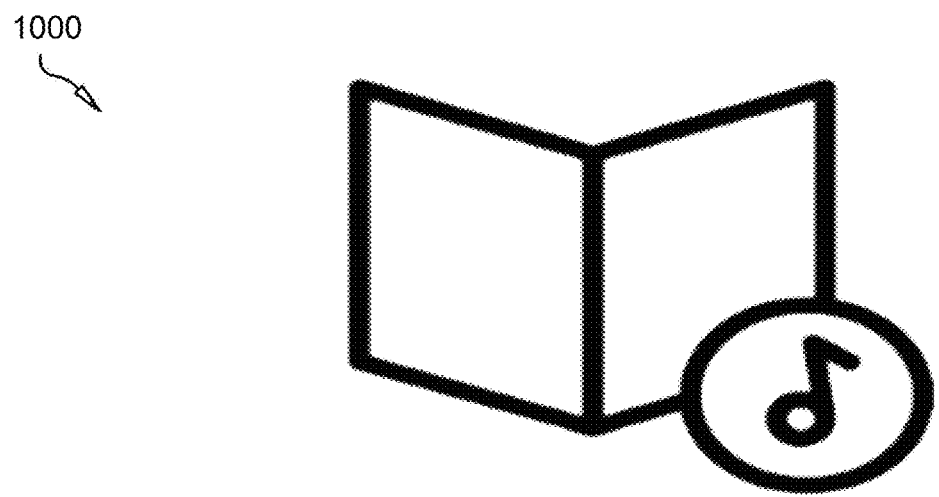
FIG. 10 is a perspective view of an exemplary a physical media outlet, in accordance with the present invention.

Turning now to FIG. 10. the method 100 also includes the Step 132 of storing a tone variation of the cloned voice on the user device or a physical media outlet. In some embodiments, the physical media outlet 1000 may include, without limitation, an audio book, a stuffed toy, a smart phone, tablet, and a laptop that is in connection with the training server. This serves to recreate the voice of the original user 202 in a physical structure that is used and easily accessible to the public.

Figure 11:
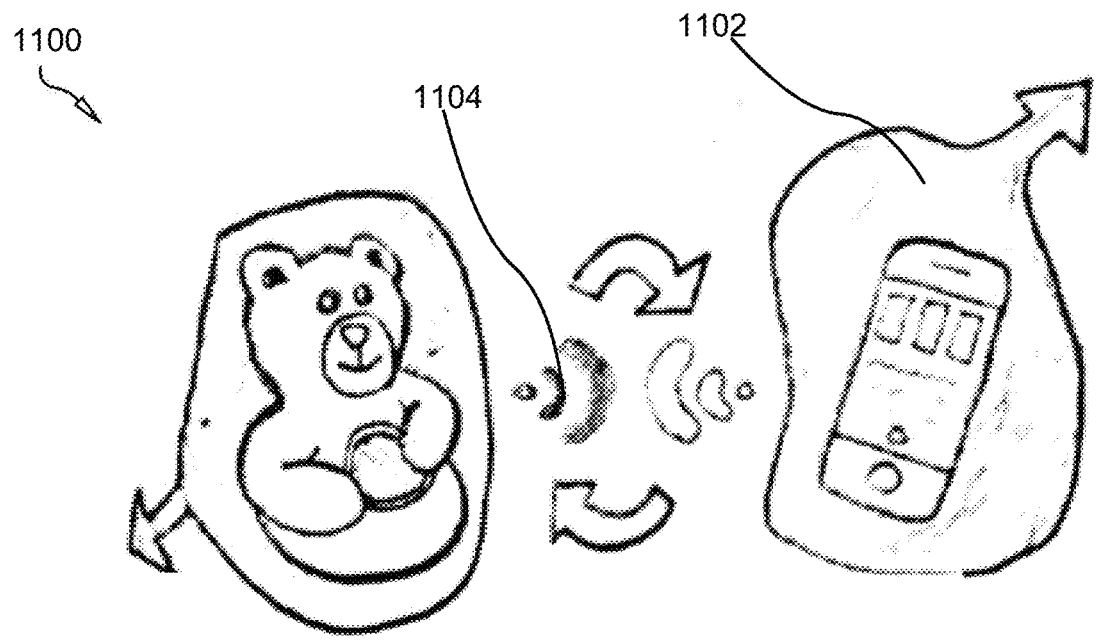
FIG. 11 is a diagram, showing a stuffed toy in communication with the training server, and streaming the cloned voice, in accordance with the present invention.

For example, FIG. 11 shows a stuffed toy 1100 in communication with the training server, and streaming the cloned voice 1104 of an original user 202. The operational user 204 accesses and listens to the cloned voice 1104 through a personal communication device 1102.

Figure 12:
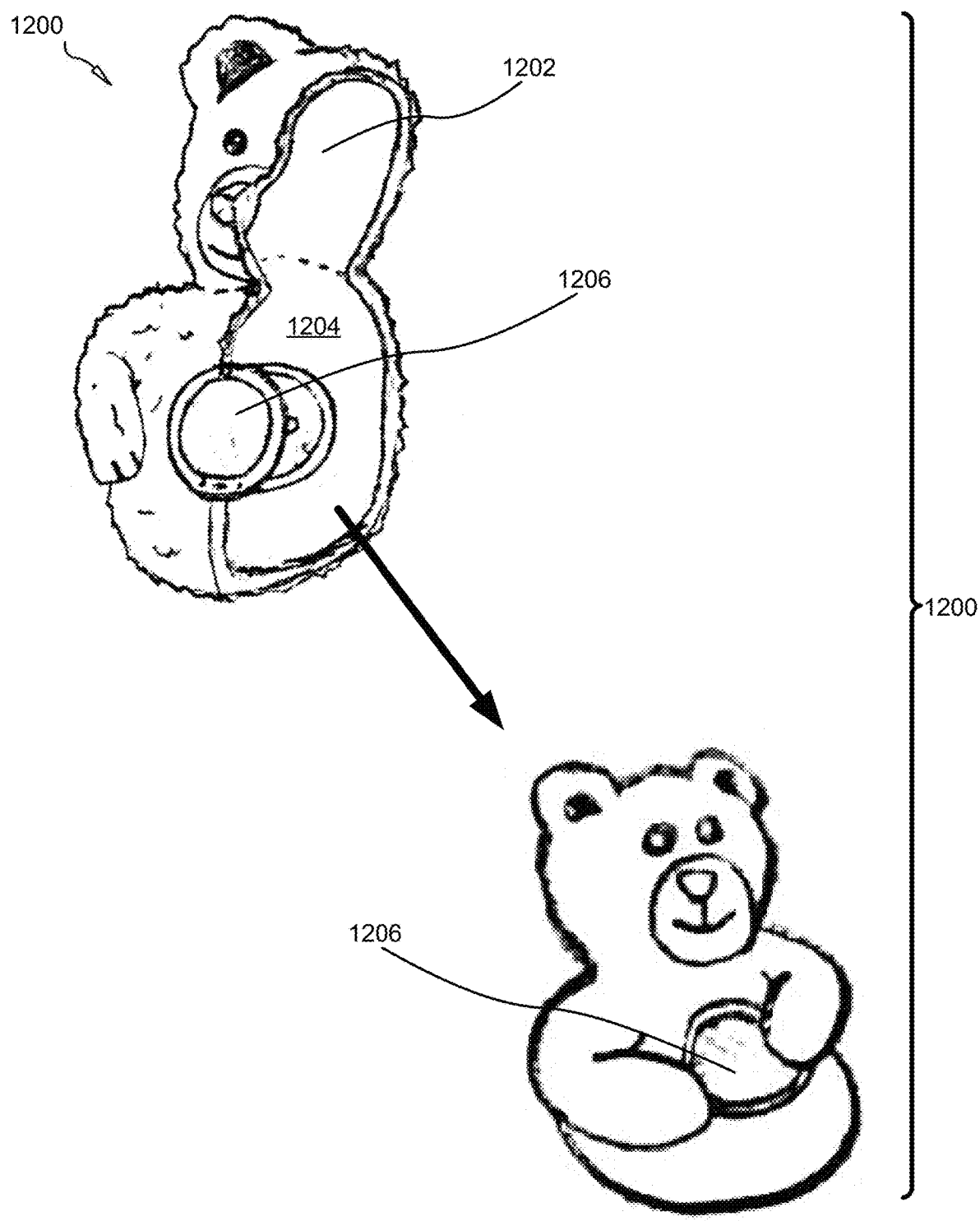
FIG. 12 is a perspective view of an exemplary stuffed toy containing a speaker and transreceiver, in accordance with the present invention.

In alternative embodiments, an additional step may also include streaming the phoneme clips of the cloned voice through the user device or the physical media outlet. In one exemplary use, the cloned voice of the original user 202 transmits from a stuffed toy, or an audiobook. Yet another example of the physical media outlet being operable to stream the cloned voice is shown in FIG. 12. As illustrated, a stuffed toy bear 1200 has an inner cavity 1202 filled with stuffing 1204 and a transreceiver 1206 for communicating with the training server; and thereby receiving the streaming audio of the cloned voice. The toy bear 1200 can be opened for insertion of the transreceiver 1206, and then closed to enable display, playing, and other functions associated with stuffed toys.

Although the process-flow diagrams show a specific order of executing the process steps, the order of executing the steps may be changed relative to the order shown in certain embodiments. Also, two or more blocks shown in succession may be executed concurrently or with partial concurrence in some embodiments. Certain steps may also be omitted from the process-flow diagrams for the sake of brevity. In some embodiments, some or all the process steps shown in the process-flow diagrams can be combined into a single process. Depending on the capabilities of the device, the method 100 is automated locally or through an online training system.

Figure 13:
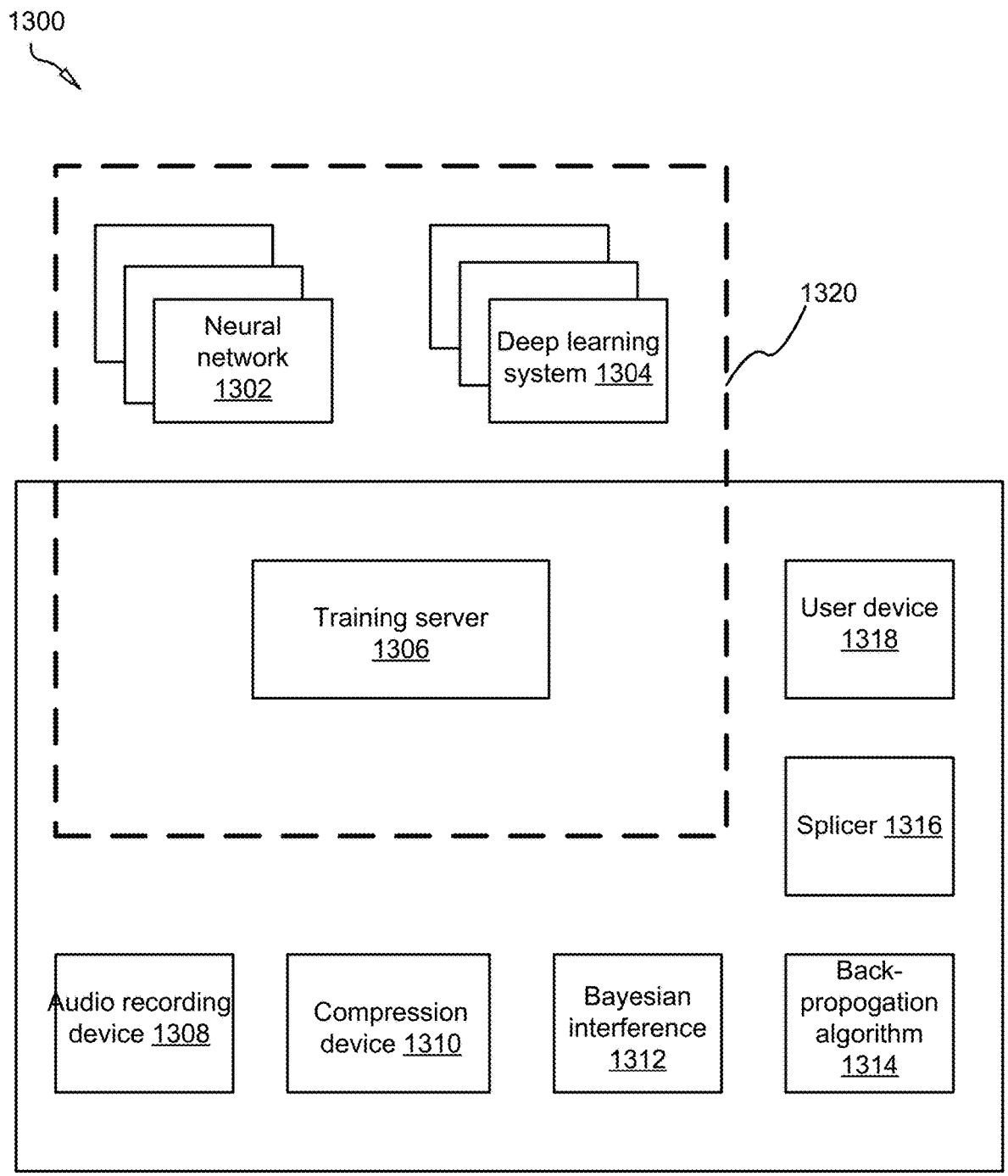
FIG. 13 is a schematic diagram of an exemplary system for posthumous dynamic speech synthesis using neural networks and deep learning, in accordance with the present invention.

FIG. 13 illustrates a block diagram of an exemplary system 1300 for posthumous dynamic speech synthesis using neural networks and deep learning. The system 1300 serves to digitally clone the voice of an original user 202 through application of a neural network 1302 and a deep learning subsystem 1304 operable on a training server 1306. The synthesizing of the original voice through the neural network 1302 and a deep learning subsystem 1304 enables duplications of the vocal frequency, personality, and characteristics of the voice 206 from the original user 202.

In some embodiments, the system 1300 comprises a plurality of modules configured to functionally execute the posthumous dynamic speech synthesis. These modules in the described embodiments include an audio recording device 1308 that is configured to record a voice of an original user 202, whereby a voice data is generated. The system 1300 may also utilize a compression device 1310 operable to compress the voice data to a lossy MP3 audio file. The compression device 1310 may include, without limitation, a vocoder.

In other embodiments, the compression device 1310 is a vocoder operable to convert, through transcription, the voice data to text. In this manner, a phoneme is matched with the text. The system 1300 may also include the vocoder compressing the phoneme, whereby the compressed phoneme produces a spectrogram. Further, the vocoder converting the spectrogram into a lossless grayscale Portable Network Graphic file having multiple pixel coordinates.

In other embodiments, the system 1300 enables the vocoder to encode the lossless grayscale Portable Network Graphic file to generate the pixel coordinates. Additionally, the vocoder decompresses the encoded pixel coordinates, whereby a cloned voice is synthesized, the cloned voice being substantially a duplicate of the voice of the original user 202.

In yet other embodiments, the system 1300 comprises Bayesian inference 1312 that is operable to construct a neural network. The neural network analyzes a speech pattern in the cloned voice. The system 1300 also includes a backpropagation algorithm 1314. The backpropagation algorithm is applied to the speech pattern to recalculate the weight of at least one possibility of the cloned voice.

In yet other embodiments, the system 1300 comprises multiple phoneme clips that are generated from the cloned voice. The system 1300 also includes a splicer 1316 operable to splice the phoneme clips to produce phrases in the vocal frequency, personality, and characteristics of the cloned voice. The training server 1306, discussed above is operable to store the phoneme clips and a tone variation of the cloned voice. Finally, the system 1300 includes a user device 1318 that is configured to recreate the original voice of the original user 202, and play the cloned voice through a streaming signal. The neural network 1302, the deep learning subsystem 1304, and the training server 1306 are operable on a cloud 1320; or in other embodiments, a remote server, a processor, or a computer.

Figure 14:
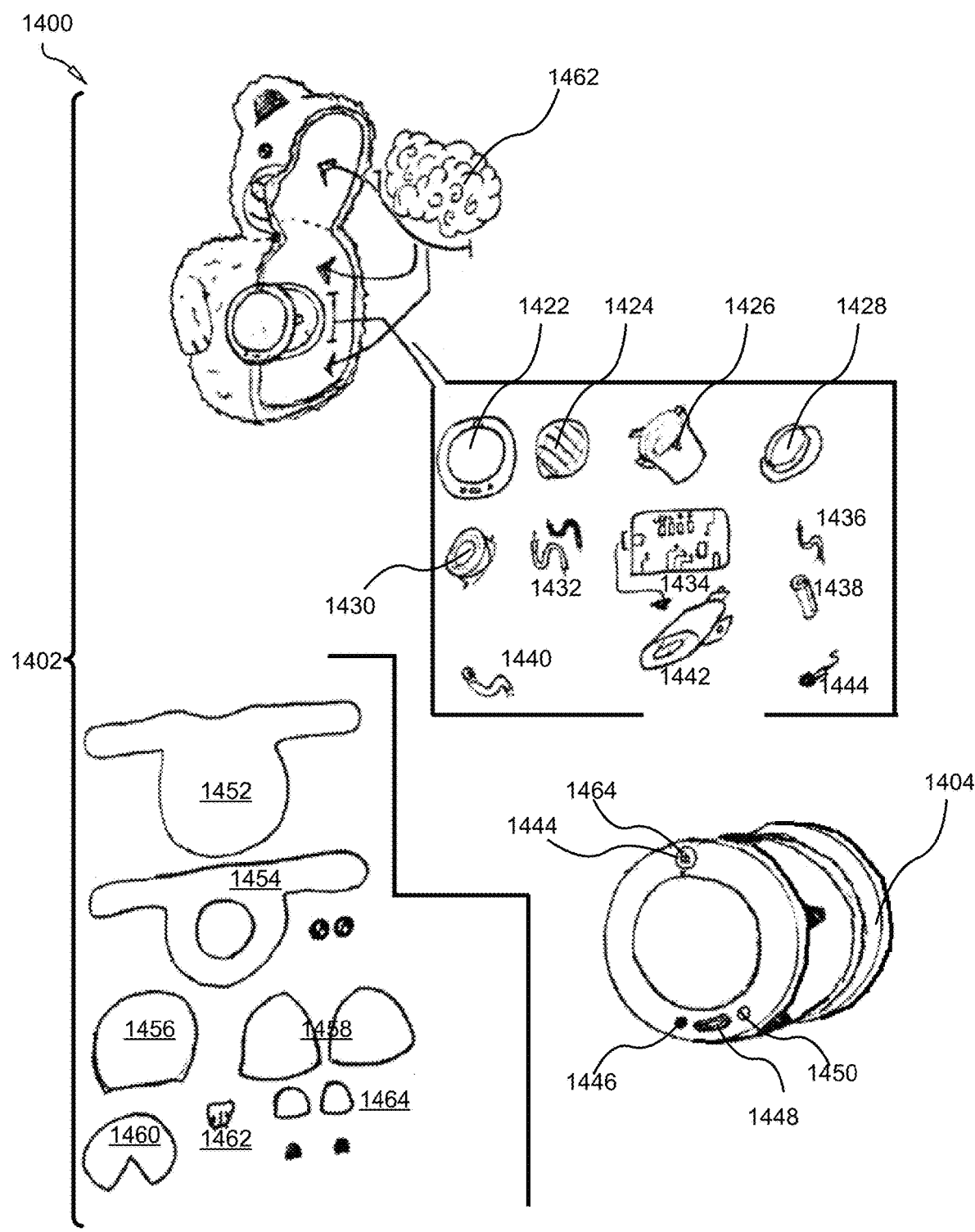
FIG. 14 is a perspective view of an exemplary physical media outlet, depicted as a stuffed toy, showing close up views of material components and the elements of the speaker, in accordance with the present invention.

In alternative embodiments, the system 1300 stores the cloned voice, or a toned variation thereof, on a physical media outlet 1400 (See FIG. 14). In some embodiments, the physical media outlet 1400 is a stuffed toy that is in connection with the training server. This serves to recreate the voice of the original user 202 in a physical structure that is used and easily accessible to the public. In one non-limiting embodiment, the stuffed toy 1400 has construction elements 1402 that make up the body and fabric, such as front panel 1422. Inside the stuffed toy 1400 is a speaker or transreceiver 1404 that includes a circuit board 1434, speaker housing 1426 comprising a cylindrical component, speaker wire 1432, electrical wire 1440, a microphone 1444, a power supply 1442, a screen 1524, and LED strip 1436. However, in other embodiments, the synthesized cloned voice may be streamed through other components, such as audio books, laptops, smartphones, and the like.

The toy 1400 may comprise stuffing 1462, brackets 1452-1454 adapted to fix the speaker 1404 in place, a proximity sensor 1464, a light sensor 1450, a touch sensor 1448, and a power on button 1446. Various polymeric components or shells 1456, 1458, 1464, 1462, and 1460 may be incorporated into the toy 1402 to protect electrical components of the device 1400.

In conclusion, system 1300 and method 100 for posthumous dynamic speech synthesis digitally clones the original voice of a deceased user, which allows an operational user to remember the original user, post mortem. The system 1300 and method 100 utilizes a neural network and deep learning to digitally duplicate the vocal frequency, personality, and characteristics of the original voice from the deceased user.

This systematic approach to dynamic speech synthesis involves several stages of compression, coding, decoding, and training the speech patterns of original voice. The data processing of original voice includes audio sampling and a Lossy-Lossless method of dual compression. Additionally, the voice data is compressed to generate a Mel spectrogram. A voice codec converts the spectrogram into a PNG file, which is synthesized into the cloned voice. After the algorithmic operations, coding, and decoding of voice data, the subsequently generated cloned voice is implemented into a physical media outlet for consumption by the operational user.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. One or more non-transitory computer storage media storing computer-usable instructions, that when used by one or more computing devices, cause the one or more computing devices to perform a method for posthumous dynamic speech synthesis using neural networks and deep learning, the method comprising:
recording a voice of an original user, whereby a voice data is generated;
compressing the voice data to a lossy MP3 audio file;
converting, through transcription, the voice data to text;
matching, through phoneme identification, the text to a phoneme;
compressing the phoneme, whereby the compressed phoneme produces a Mel spectrogram;
converting the Mel spectrogram into a lossless grayscale Portable Network Graphic file having multiple pixel coordinates;
encoding, with a vocoder, the lossless grayscale Portable Network Graphic file to generate the pixel coordinates;
decompressing, with the vocoder, the encoded pixel coordinates, whereby a cloned voice is synthesized, the cloned voice being a duplicate of the voice of the original user;
constructing, with Bayesian inference, a neural network;
analyzing, with the neural network, a speech pattern in the cloned voice;
applying a backpropagation algorithm to recalculate a weight of at least one possibility of the cloned voice;
generating multiple phoneme clips of the cloned voice;
splicing the phoneme clips to produce phrases in the vocal frequency, personality, and characteristics of the cloned voice;
storing the phoneme clips and a tone variation of the cloned voice on a user device or a physical media outlet for recreating the original voice of the original user; and
streaming the phoneme clips of the cloned voice through the user device or the physical media outlet.

2. The one or more computer storage media of claim 1, wherein the step of compressing, with the vocoder, the phoneme, further comprises running a primary lossy compression.

3. The one or more computer storage media of claim 2, wherein the step of compressing, with the vocoder, the phoneme, further comprises running a secondary lossless compression.

4. A system for posthumous dynamic speech synthesis using neural networks and deep learning, the system comprising:
an audio device operable to record a voice of an original user, whereby a voice data is generated;
a compression device operable to compress the voice data to a lossy MP3 audio file;
a vocoder operable to convert, through transcription, the voice data to text;
a phoneme being matched with the text;
the vocoder compressing the phoneme, whereby the compressed phoneme produces a spectrogram;
the vocoder converting the spectrogram into a lossless grayscale Portable Network Graphic file having multiple pixel coordinates;
the vocoder encoding the lossless grayscale Portable Network Graphic file to generate the pixel coordinates;
the vocoder decompressing the encoded pixel coordinates, whereby a cloned voice is synthesized, the cloned voice being a duplicate of the voice of the original user;
a Bayesian inference operable to construct a neural network;
the neural network analyzing a speech pattern in the cloned voice;
a backpropagation algorithm applied to the speech pattern to recalculate a weight of at least one possibility of the cloned voice;
multiple phoneme clips being generated from the cloned voice;
a splicer operable to splice the phoneme clips to produce phrases in the vocal frequency, personality, and characteristics of the cloned voice;
a training server operable to store the phoneme clips and a tone variation of the cloned voice; and
a user device operable to recreate the original voice of the original user.

* * * * *